(12) United States Patent
Kwak et al.

(10) Patent No.: US 7,711,512 B2
(45) Date of Patent: May 4, 2010

(54) SYSTEM AND METHOD FOR TESTING SEMICONDUCTOR DEVICE

(75) Inventors: Sang-Keun Kwak, Seoul (KR);
Kyong-Ho Jeon, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 68 days.

(21) Appl. No.: 12/129,471

(22) Filed: May 29, 2008

(65) Prior Publication Data
US 2008/0297190 A1     Dec. 4, 2008

(30) Foreign Application Priority Data
May 31, 2007    (KR)    ...................... 10-2007-0053204

(51) Int. Cl.
*G01R 31/00*    (2006.01)
(52) U.S. Cl. ...................... 702/117; 324/765
(58) Field of Classification Search ............. 702/57–59, 702/117–120, 182–183, 185–186; 714/718–720, 714/724, 738, 742; 324/763–765
See application file for complete search history.

(56) References Cited
U.S. PATENT DOCUMENTS

| | | | | |
|---|---|---|---|---|
| 5,627,762 A | * | 5/1997 | Cameron et al. | ............ 700/279 |
| 5,754,838 A | * | 5/1998 | Shibata et al. | ............... 713/600 |
| 6,470,467 B2 | * | 10/2002 | Tomishima et al. | ......... 714/744 |
| 6,671,842 B1 | | 12/2003 | Phan et al. | |
| 6,944,039 B1 | * | 9/2005 | Nataraj et al. | ............. 365/49.17 |
| 7,117,409 B2 | | 10/2006 | Wu et al. | |
| 7,149,474 B1 | * | 12/2006 | Mikhak | ..................... 455/41.2 |
| 2008/0048726 A1 | * | 2/2008 | Hafed | ........................... 327/9 |

FOREIGN PATENT DOCUMENTS

| | | |
|---|---|---|
| JP | 2000-311931 | 11/2000 |
| JP | 2003-156543 | 5/2003 |
| JP | 2003-217299 | 7/2003 |
| KR | 10-1992-0021995 | 11/1992 |
| KR | 10-2007-0045081 | 5/2007 |
| WO | 2006/058082 | 6/2006 |

\* cited by examiner

*Primary Examiner*—Eliseo Ramos Feliciano
*Assistant Examiner*—Mary C Baran
(74) *Attorney, Agent, or Firm*—Volentine & Whitt, PLLC

(57) ABSTRACT

According to an example embodiment, a semiconductor device test system includes a semiconductor device and a test apparatus. The semiconductor device includes a plurality of function blocks for performing predetermined functions at different operating speeds and a plurality of ports, each corresponding to a respective function block. The test apparatus is adapted to generate a plurality of signals with different frequencies corresponding to each of the operating speeds of the function blocks, to output a plurality of input test data to the ports in response to the signals, and to receive a plurality of output test data from the ports to determine if the semiconductor device is normal.

7 Claims, 4 Drawing Sheets

SYSTEM AND METHOD FOR TESTING SEMICONDUCTOR DEVICE

CROSS-REFERENCE TO RELATED APPLICATIONS

This application claims priority from Korean Patent Application No. 2007-0053204, which was filed on 31 May 2007. The contents of Korean Patent Application No. 2007-0053204 are hereby incorporated by reference in their entirety.

BACKGROUND

1. Technical Field

This disclosure relates to a system and method for testing a semiconductor device, and more particularly, to a system and method for testing a multi-port semiconductor device.

2. Description of the Related Art

In general, a semiconductor device test system includes a semiconductor device and a test apparatus. The function and operating speed of the semiconductor device are predetermined according to its purposes. The operating speed of the semiconductor device depends on the frequency of an external or internal clock signal. Since the semiconductor device should be capable of normal functions at a predetermined operating speed, the frequency of the clock signal significantly affects the performance of the semiconductor device.

Accordingly, the test apparatus of the semiconductor device test system should test not only the function of the semiconductor device but also the operating speed thereof. Thus, the test apparatus should apply test data to the semiconductor device with a clock signal corresponding to the predetermined frequency and test whether the semiconductor device performs normal functions. When the test apparatus applies test data corresponding to a clock signal with a frequency higher or lower than the predetermined frequency, the reliability of the test result is degraded.

FIG. 1 is a diagram of a conventional single-port semiconductor device test system. Although a typical semiconductor device test system is constructed such that a test apparatus 1 tests a plurality of semiconductor devices 2 at the same time, for brevity FIG. 1 illustrates a system in which the test apparatus 1 tests only a single semiconductor device 2.

Referring to FIG. 1, the test apparatus 1 includes a frequency generation unit 10, a test data generation unit 20, and a data determination unit 30. The test apparatus 1 further includes an output driver ODR and an input driver IDR.

The frequency generation unit 10 generates a frequency corresponding to the semiconductor device 2 to be tested. The frequency generation unit 10 includes a low-frequency generator 11, a frequency controller 12, and a reference frequency generator 13. The low-frequency generator 11 generates a stable low-frequency signal Lfreq. The low-frequency generator 11 may generate the low-frequency signal Lfreq using a low-frequency generation apparatus, such as a crystal oscillator. The frequency controller 12 outputs a frequency control signal Fcon, which is set by a user, to the reference frequency generator 13. Also, the reference frequency generator 13 converts the low-frequency signal Lfreq into a high-frequency reference frequency signal Pfreq in response to the frequency control signal Fcon. The low-frequency generation apparatus, such as the crystal oscillator, cannot generate a stable high-frequency signal. Also, the frequency generation unit 10 should be constructed to generate different frequencies according to a user's setting. Thus, the reference frequency generator 13 multiplies the frequency of the low-frequency signal Lfreq generated by the low-frequency generator 11 in response to the frequency control signal Fcon applied from the frequency controller 12, and generates the high-frequency reference frequency signal Pfreq for testing the semiconductor device 2.

The test data generation unit 20 includes an operation clock generator 21, a pattern data generator 22, a driver clock generator 23, and a driver controller 24. The operation clock generator 21 generates an operation clock signal Nclk corresponding to the operating speed of the semiconductor device 2 to be tested in response to the reference frequency signal Pfreq. The pattern data generator 22 outputs test data Tdata in response to the operation clock signal Nclk. Here, the test data Tdata is data that is preset to test the semiconductor device 2. The test apparatus 1 should store normal output data of the semiconductor device 2 with respect to the test data Tdata. In other words, the test apparatus 1 should store test expectation data that the semiconductor device 2 should output after the semiconductor device 2 receives the test data Tdata. Like the operation clock generator 21, the driver clock generator 23 generates a driver clock signal Dclk in response to the reference frequency signal Pfreq. The driver clock signal Dclk is a clock signal for controlling the operation timing of the output driver ODR of the test apparatus 1. The driver controller 24 outputs a driver control signal Dcon for controlling the output driver ODR in response to the driver clock signal Dclk. Although it is illustrated in FIG. 1 that the operation clock generator 21 and the driver clock generator 23 are separately provided, when the driver controller 24 is constructed to receive the operation clock signal Nclk from the operation clock generator 21 and control the output driver ODR, the driver clock generator 23 may be omitted.

The data determination unit 30 includes a strobe generator 31 and a logic determiner 32. The strobe generator 31 generates a strobe signal "str" in response to the reference frequency signal Pfreq. There are few cases where the semiconductor device 2 is independently used. That is, the semiconductor device 2 should receive data from and transmit data to an external device, such as another semiconductor device. For this, the semiconductor device 2 should receive input data from the external device and transmit output data to the external device at a specific point in time. When the semiconductor device 2 outputs the output data too fast or slowly, the external device cannot precisely receive the output data from the semiconductor device 2. Therefore, the semiconductor device 2 should output the output data to the external device at a specific point in time. The strobe signal "str" is a signal for determining if output test data Tout output from the semiconductor device 2 is precisely applied at a specific point in time. Thus, the strobe signal "str" allows the input driver IDR to receive the output test data Tout output from the semiconductor 2 only during an enabling period of the strobe signal "str." The logic determiner 32 compares test result data Trst applied from the input driver IDR with the previously stored test expectation data corresponding to the test data Tdata and determines if the semiconductor device 2 is good or bad. The test expectation data is previously stored data that the semiconductor device 2 should output in response to the test data Tdata. When the test result data Trst is not equal to the test expectation data, it is determined that the corresponding semiconductor device 2 is bad.

The output driver ODR receives the test data Tdata under the control of the driver control signal Dcon and outputs input test data Tin to the semiconductor device 2. The input driver IDR receives the output test data Tout from the semiconductor device 2 in response to the strobe signal "str" and outputs the test result data Trst to the logic determiner 32.

The semiconductor device 2 receives the input data Tin and outputs the output data Tout via a port. The semiconductor device 2 performs a previously designed function in response to the input test data Tin and outputs the output test data Tout as the result of the performed function.

With technical developments, semiconductor devices are increasingly becoming high-integrated and multifunctional. However, the ongoing downscaling of various electronic appliances has led to a strong need for more high-integrated and multifunctional semiconductor devices. As a result, multi-port semiconductor devices are being developed and employed. A multi-port semiconductor device is a single semiconductor device including a plurality of input/output (I/O) ports. In this case, the multi-port semiconductor device may input and output different data via the respective ports with respect to the single semiconductor device. The single semiconductor device may include a plurality of function blocks corresponding to the respective ports so that the function blocks can perform respectively different operations. Alternatively, clock signals and data corresponding to different frequencies via the respective ports may be applied to the multi-port semiconductor device with respect to the single semiconductor device including a single function block.

FIG. 2 is a diagram of a conventional multi-port semiconductor device test system.

FIG. 2 illustrates a semiconductor device including four function blocks, which is an example of a multi-port semiconductor device.

When all the function blocks 3-1 to 3-4 of the multi-port semiconductor device 3 operate in response to the same operation clock signal, a test apparatus 1 of the multi-port semiconductor device 3 is similar to the test apparatus 1 of the single-port semiconductor device test system shown in FIG. 1. However, since the multi-port semiconductor device 3 is employed as a semiconductor device, a plurality of ports port1 to port4 of the semiconductor device 3 receive input test data Tin from the test apparatus 1 and transmit output test data Tout to the test apparatus 1. It is illustrated in FIG. 2 that each of the ports port1 to port4 receives the input test data Tin from a single output driver ODR and transmits the output test data Tout to a single input driver IDR. However, when the respective function blocks 3-1 to 3-4 receive different input test data Tin and transmit output test data Tout, the test apparatus 1 may include a plurality of input drivers IDR and a plurality of output drivers ODR corresponding respectively to the ports port1 to port4.

Since the test apparatus 1 shown in FIG. 2 is the same as the test apparatus 1 shown in FIG. 1, a description thereof will be omitted here. Assuming that the plurality of function blocks 3-1 to 3-4 operate at the same speed, the test apparatus 1 applies the input test data Tin to the function blocks 3-1 to 3-4 via the ports port1 to port4 in order to test the semiconductor device 3. The function blocks 3-1 to 3-4 of the semiconductor device 3 perform predetermined different operations in response to the input test data Tin and output respective output test data Tout to the test apparatus 1.

That is, when the function blocks 3-1 to 3-4 operate at the same speed, the test apparatus 1 applies the input test data Tin to the function blocks 3-1 to 3-4 at the same time and receives the output test data Tout from the function blocks 3-1 to 3-4 at the same time, thereby shortening the time required for testing the semiconductor device 3.

However, when the function blocks 3-1 to 3-4 of the semiconductor device 3 operate at different speeds, for example, when a first function block 3-1 operates at a speed of 100 MHz, a second function block 3-2 operates at a speed of 133 MHz, a third function block 3-3 operates at a speed of 150 MHz, and a fourth function block 3-4 operates at a speed of 200 MHz, the test apparatus 1 should transmit input test data Tin and receive output test data Tout at the operating speed of one of the function blocks 3-1 to 3-4. Therefore, a test operation must be performed several times corresponding to each of the function blocks 3-1 to 3-4. As a result, it is time consuming to test the semiconductor device 3. Furthermore, when the plurality of function blocks 3-1 to 3-4 of the semiconductor device 3 are interlocked to input and output data, the conventional test apparatus 1, which applies the input test data Tin to the semiconductor device 3 at one of the operating speeds of the function blocks 3-1 to 3-4 during a one-time test operation, is not capable of performing a reliable test. In a worst case scenario, the test apparatus 1 is completely unable to perform test operations.

SUMMARY

An example embodiment provides a semiconductor device test system, which can test a semiconductor device including a plurality of function blocks with different operating speeds by inputting/outputting test data to/from the semiconductor device at different frequencies corresponding to the respective function blocks.

Another embodiment provides a method of testing the semiconductor device.

In one aspect, example embodiments are directed to a semiconductor device test system including: a semiconductor device including a plurality of function blocks for performing predetermined functions at different operating speeds and a plurality of ports corresponding respectively to the function blocks; and a test apparatus for generating a plurality of signals with different frequencies corresponding to each of the operating speeds of the function blocks, outputting a plurality of input test data to the ports in response to the signals, respectively, and receiving a plurality of output test data from the ports, respectively, to determine if the semiconductor device is normal.

In an example embodiment, the test apparatus may include: a frequency generation unit for generating the signals in response to a user's command; a plurality of block test units for generating the test data in response to the signals and receiving test result data, respectively, to determine if the semiconductor device is normal; a plurality of output drivers for receiving the test data to output the input test data to the corresponding ports, respectively; and a plurality of input drivers for receiving the output test data from the corresponding ports to output the test result data, respectively.

The frequency generation unit may include: a low-frequency generator for generating a stable low-frequency signal; a multi-frequency controller for outputting a multi-frequency control signal in response to a user's command; a multi-frequency selector for outputting a plurality of predetermined information data for designating each of the frequencies of the signals in response to the multi-frequency control signal; and a multi-frequency generator for outputting the signals in response to the information data.

The multi-frequency selector may select a predetermined number of information data of the predetermined information data in response to the multi-frequency control signal and output the selected information data.

Each of the block test units may include: a test data generation unit for generating test data to test the corresponding function block in response to the corresponding signal; and a data determination unit for outputting a strobe signal for designating a point in time at which the corresponding input driver receives the output test data, in response to the signal and receiving the test result data from the input driver to determine if the corresponding function block of the semiconductor device is normal.

The test data generation unit may include: an operation clock generator for generating an operation clock signal in response to the corresponding signal; a pattern data generator for generating test data to test the corresponding function block in response to the operation clock signal; a driver clock generator for generating a driver clock signal in response to the corresponding signal; and a driver controller for outputting a driver control signal for controlling the corresponding output driver in response to the driver clock signal.

The data determination unit may include: a strobe generator for generating the strobe signal in response to the corresponding signal; and a logic determiner for comparing the test result data with previously stored test expectation data to determine if the corresponding function block of the semiconductor device is normal.

In another example embodiment, the test apparatus may include a frequency generation unit for generating the plurality of signals in response to a user's command; a plurality of test data generation units for generating a plurality of test data in response to the signals, respectively; a plurality of output drivers for receiving the test data to output the plurality of input test data to the corresponding ports, respectively; a data determination unit for outputting a flag signal for prioritizing the output test data applied from the ports and receiving test result data to determine if the semiconductor device is normal; and an input driver for sequentially receiving the plurality of output test data in response to the flag signal to output the test result data.

In another aspect, an example embodiment is directed to a method of testing a semiconductor device. The method includes: generating a plurality of signals with different frequencies in response to a user's command; generating a plurality of test data in response to the respective signals; receiving the plurality of test data and outputting a plurality of input test data to a plurality of ports of a semiconductor device, respectively; receiving a plurality of output test data from the plurality of ports of the semiconductor device and outputting test result data; and comparing the test result data with previously stored test expectation data and determining if the semiconductor device is normal.

The generation of the signals may include: generating a stable low-frequency signal; determining use or disuse of multiple frequencies in response to a user's command to output a multi-frequency control signal; outputting a plurality of information data for designating frequencies of the signals in response to the multi-frequency control signal; and generating the plurality of signals in response to the plurality of information data, respectively.

The generation of the test data may include: generating a plurality of operation clock signals in response to the signals, respectively; generating the plurality of test data in response to the plurality of operation clock signals, respectively; generating a plurality of driver clock signals in response to the signals, respectively; and generating a plurality of driver control signals in response to the driver clock signals, respectively.

The output of the test data may include receiving the plurality of test data in response to the plurality of driver control signals and outputting the plurality of input test data to the corresponding ports of the semiconductor device.

In an example embodiment, the receiving of the test data may include: generating a plurality of strobe signals for designating points in time at which the plurality of output test data are respectively received in response to the signals; and receiving the plurality of output test data in response to the plurality of strobe signals and outputting the plurality of test result data.

The determination of if the semiconductor device is normal may include comparing the plurality of test result data with a plurality of previously stored test expectation data corresponding to the plurality of test data, respectively.

In another example embodiment, the receiving of the test data may include: generating a flag signal for prioritizing the plurality of output test data in response to the plurality of signals and a strobe signal for designating points in time at which the plurality of output test data are received; and selecting one of the plurality of output test data in response to the flag signal and receiving the selected output test data in response to the strobe signal to output test result data.

BRIEF DESCRIPTION OF THE DRAWINGS

The foregoing and other objects, features and advantages of the inventive principles will be apparent from the more particular description of example embodiments, as illustrated in the accompanying drawings. The drawings are not necessarily to scale, emphasis instead being placed upon illustrating the principles of the invention.

DETAILED DESCRIPTION

The inventive principles are described more fully hereinafter with reference to the accompanying drawings, in which example embodiments are shown.

Figure 3:
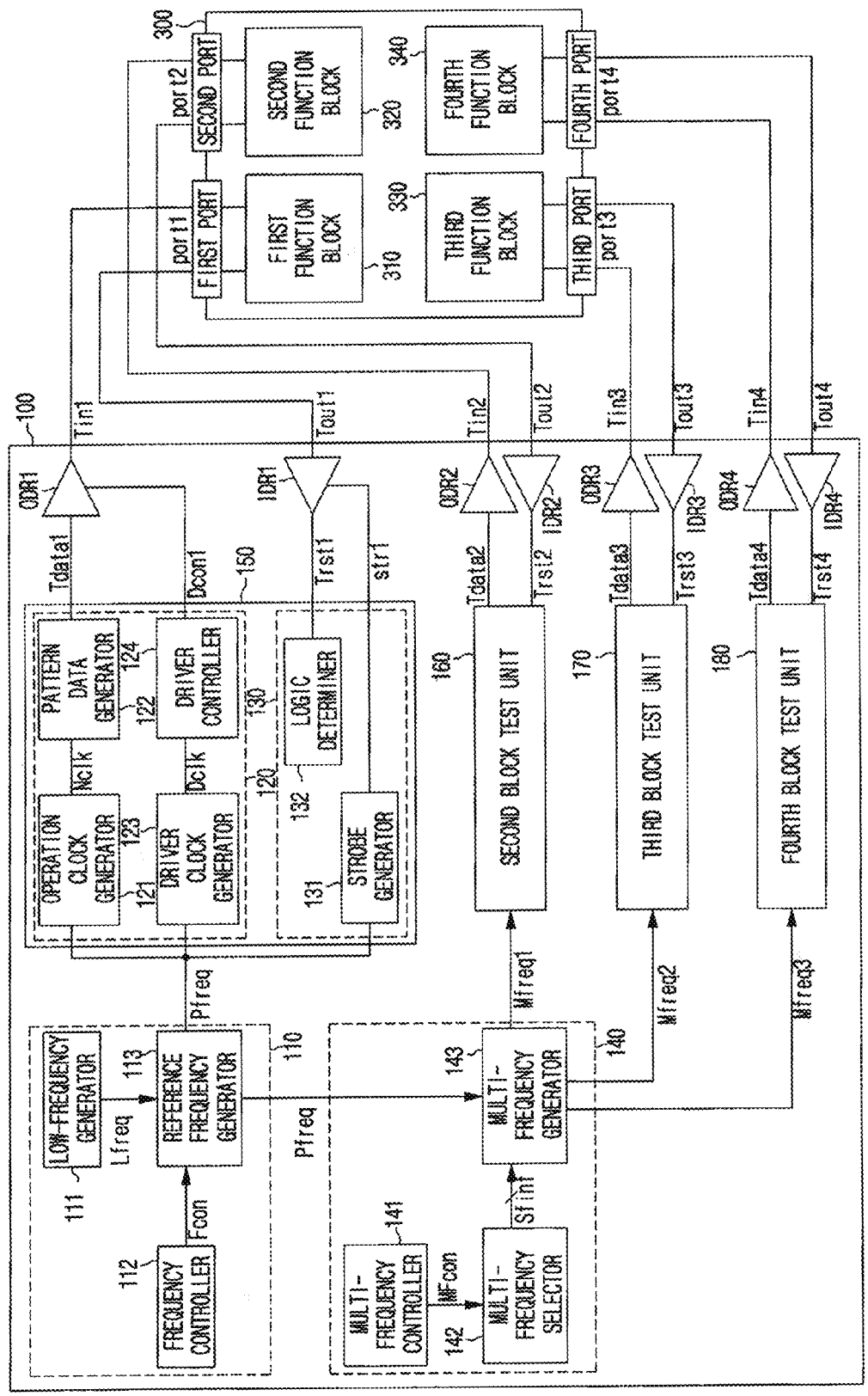
FIG. 3 is a diagram of a semiconductor device test system according to an example embodiment of the present invention.

FIG. 3 is a diagram of a semiconductor device test system according to an exemplary embodiment of the present invention. Referring to FIG. 3, a semiconductor device 300 includes a plurality of function blocks 310, 320, 330, 340 and a plurality of ports port1, port2, port3, port4. The function blocks 310-340 operate at different speeds and input and output data via the corresponding ports port1-port4, respectively.

Hereinafter, the semiconductor device test system will be described with reference to FIG. 3. Referring to FIG. 3, a test apparatus 100 includes a frequency generation unit 110, a multi-frequency generation unit 140, a plurality of block test units 150, 160, 170, 180, a plurality of output drivers ODR1, ODR2, ODR3, ODR 4 that correspond to the first through fourth block test units 150, 160, 170, 180, respectively, and a plurality of input drivers IDR1, IDR2, IDR3, IDR4 that correspond to the first through fourth block test units 150, 160, 170, 180, respectively.

Figure 1:
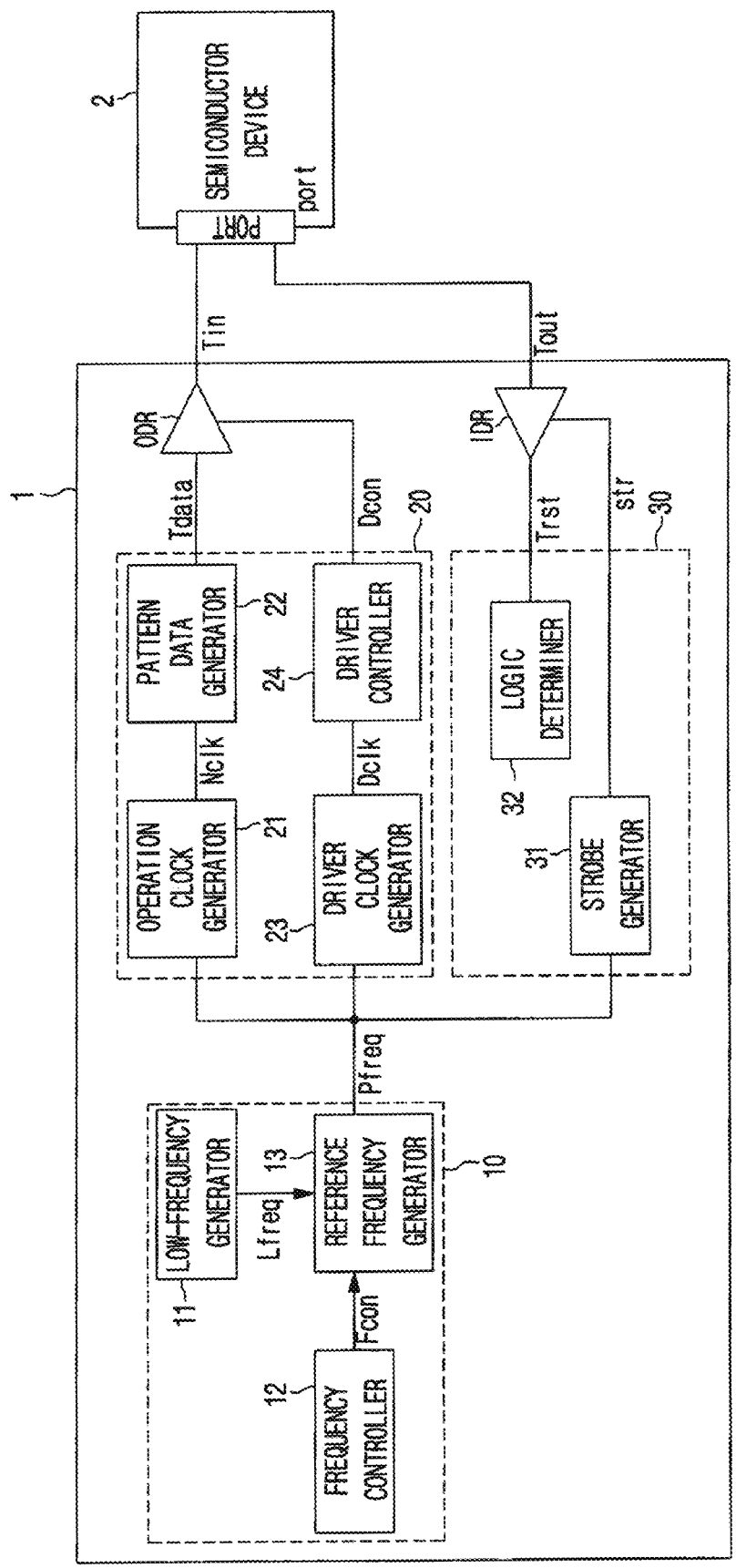
FIG. 1 is a diagram of a conventional single-port semiconductor device test system.
Figure 2:
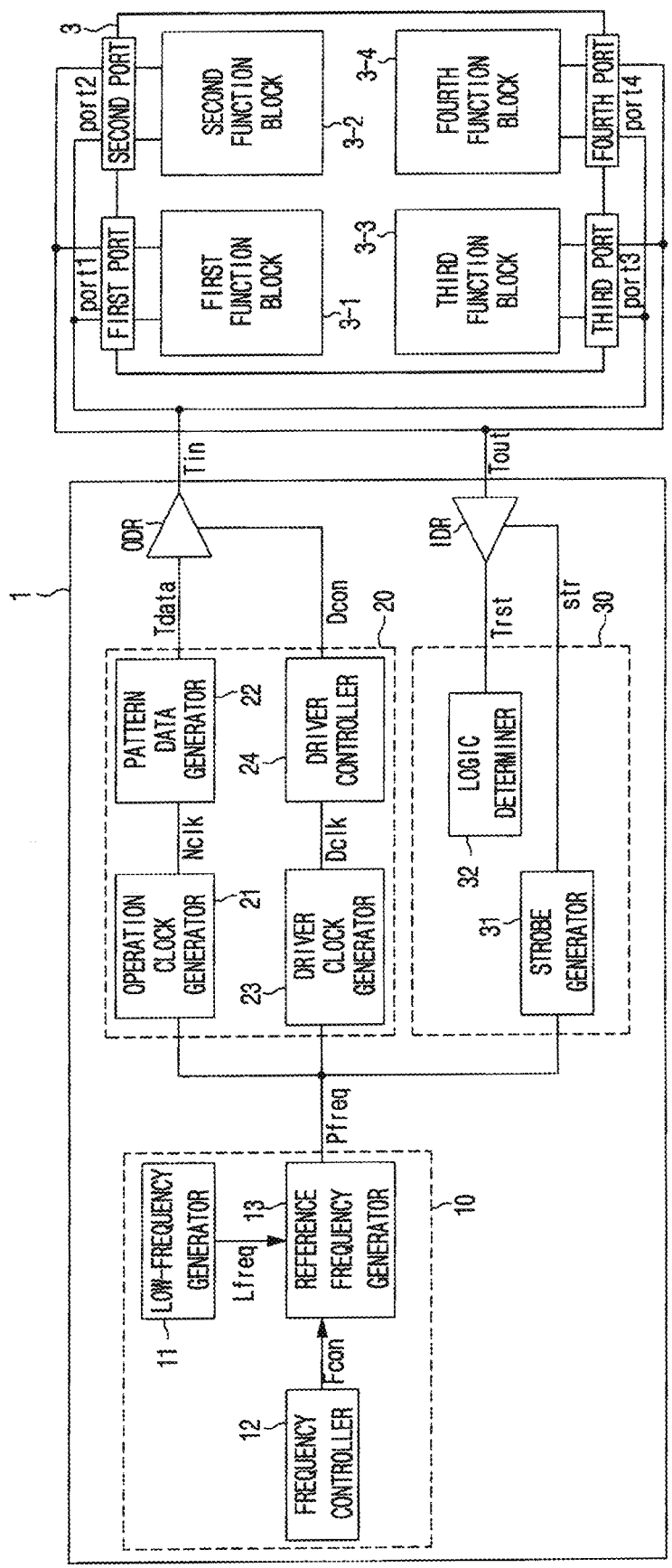
FIG. 2 is a diagram of a conventional multi-port semiconductor device test system.

The frequency generation unit 110 includes a low-frequency generator 111, a frequency controller 112, and a reference frequency generator 113. The low-frequency generator 111 generates a stable low-frequency signal Lfreq, and the frequency controller 112 outputs a frequency control signal Fcon, which is set by a user, to the reference frequency generator 113. Also, the reference frequency generator 113 converts the low-frequency signal Lfreq into a high-frequency reference frequency signal Pfreq in response to the frequency control signal Fcon. As described above with reference to FIG. 1, a frequency generation apparatus cannot generate a stable high-frequency signal. Thus, the reference frequency generator 110 multiplies the frequency of the stable low-frequency signal Lfreq generated by the low-frequency generator 111 in response to the frequency control signal Fcon applied from the frequency controller 112, and generates the required reference frequency signal Pfreq. Although the reference frequency signal Pfreq may be set irrespective of the operating speeds of the function blocks 310 to 340 of the semiconductor device 300, the reference frequency signal Pfreq is preferably set to correspond to the operating speed of one (e.g., the first function block 310) of the function blocks 310, 320, 330, 340.

The multi-frequency generation unit 140 includes a multi-frequency controller 141, a multi-frequency selector 142, and a multi-frequency generator 143. The multi-frequency controller 141 outputs a multi-frequency control signal MFcon in response to a user's command. The multi-frequency control signal MFcon indicates use or disuse of multiple frequencies. The multi-frequency selector 142 allows the user to select a frequency from a plurality of preset frequencies or directly designate a frequency in response to the multi-frequency control signal MFcon and outputs selection frequency information data Sfinf. The multi-frequency generator 143 converts the reference frequency signal Pfreq into a plurality of selection frequency signals Mfreq1 to Mfreq3 in response to the selection frequency information data Sfinf applied from the multi-frequency selector 142, and outputs the plurality of selection frequency signals Mfreq1 to Mfreq3.

The first block test unit 150 receives the reference frequency signal Pfreq, and the second through fourth block test units 160 to 180 receive the corresponding selection frequency signals Mfreq1 to Mfreq3, respectively. Also, each of the block test units 150 to 180 includes a test data generation unit 120 and a data determination unit 130.

As described above, when the reference frequency signal Pfreq generated by the reference frequency generation unit 110 does not correspond to any one of the operating speeds of the function blocks 310 to 340 of the semiconductor device 300, even the first block test unit 150 may receive the selection frequency signals Mfreq1 to Mfreq3 generated by the multi-frequency generation unit 140 like the second through fourth block test units 160 to 180.

First, the first block test unit 150 will be described below. In the first block test unit 150, the test data generation unit 120 includes an operation clock generator 121, a pattern data generator 122, a driver clock generator 123, and a driver controller 124. The operation clock generator 121 generates an operation clock signal Nclk corresponding to the operating speed of the corresponding one of the function blocks 310 to 340 of the tested semiconductor device 300 in response to the reference frequency signal Pfreq. In FIG. 3, it is illustrated that the first block test unit 150 corresponds to the first function block 310 of the semiconductor device 300. Thus, assuming that the first function block 310 operates at a speed of 100 MHz, the operation clock generator 121 generates the operation clock signal Nclk at a speed corresponding to the frequency of 100 MHz. The pattern data generator 122 outputs first test data Tdata1 in response to the operation clock signal Nclk. Here, the first test data Tdata1 is data preset to test the first function block 310. The driver clock generator 123 also generates a driver clock signal Dclk in response to the reference frequency signal Pfreq like the operation clock generator 121. The driver clock signal Dclk is a clock signal for controlling the operation timing of the corresponding one of the output drivers ODR1 to ODR4 of the test apparatus 100. The driver controller 124 outputs a driver control signal Dcon in response to the driver clock signal Dclk. The driver control signal Dcon is a signal for controlling the first output driver ODR1 that outputs data via the first port port1 of the semiconductor device 300. When the driver controller 124 receives the operation clock signal Nclk from the operation clock generator 121 to control the first output driver ODR1 as described above, the driver clock generator 123 may be omitted.

The data determination unit 130 includes a strobe generator 131 and a logic determiner 132. The strobe generator 131 generates a first strobe signal str1 in response to the reference frequency signal Pfreq. The first strobe signal str1 is a signal for determining if output test data Tout applied from the first function block 310 of the semiconductor device 300 is precisely applied at a specific point in time. The first strobe signal str1 allows the first input driver IDR1 to receive first output test data Tout1 output from the first function block 310 via the first port port1 only during an enabling period of the first strobe signal str1. The logic determiner 132 compares first test result data Trst1 applied from the first input driver IDR1 with previously stored test expectation data corresponding to the first test data Tdata1 and determines if the first function block 310 of the semiconductor device 300 is normal.

The first output driver ODR1 receives the first test data Tdata1 under the control of the driver control signal Dcon and outputs first input test data Tin1 to the first port (port1) of the semiconductor device 300.

The first input driver IDR1 receives the first output test data Tout1 from the first port (port1) of the semiconductor device 300 in response to the first strobe signal str1 and outputs first test result data Trst1 to the logic determiner 132.

Each of the second through fourth block test units 160, 170, 180 has a similar construction to the first block test unit 150. Each of the second through fourth block test units 160-180 includes the test data generation unit 120 and the data determination unit 130. However, the second through fourth block test units 160-180 receive corresponding selection frequency signals Mfreq1, Mfreq2, Mfreq3, respectively, instead of the reference frequency signal Pfreq. The test data generation units 120 of the second through fourth block test units 160-180 generate an operation clock signal Nclk and a driver clock signal Dclk in response to the corresponding selection frequency signals Mfreq1, Mfreq2, Mfreq3, output test data Tdata2, Tdata3, Tdata4 in response to the operation clock signal Nclk, and output a driver control signal (not shown) for controlling the corresponding output drivers ODR2, ODR3, ODR4 in response to the driver clock signal Dclk. Also, the data determination unit 130 outputs second through fourth strobe signals (not shown) for determining if second through fourth output test data Tout2-Tout4 are precisely applied at specific points in time. The second through fourth output test data Tout2-Tout4 are applied from the second through fourth function blocks 320, 330, 340 of the semiconductor device 300 to the second through fourth input drivers IDR2, IDR3, IDR4 in response to the selection frequency signals Mfreq1, Mfreq2, Mfreq3, respectively. Thereafter, the data determination unit 130 compares second through fourth test result data Trst2 to Trst4 applied from the second through fourth input drivers IDR2-IDR4 with test expectation data stored in the respective logic determiners 132 and determines if the second through fourth function blocks 320-340 of the semiconductor device 300 operate normally.

The second through fourth output drivers ODR2-ODR4 receive the second through fourth test data Tdata2-Tdata4 under the control of driver control signals Dcon applied from the second through fourth block test units 160-180, respectively, and output second through fourth input test data Tin2-

Tin4 to the second through fourth ports (port2-port4) of the semiconductor device 300, respectively.

The second through fourth input drivers IDR2-IDR4 receive the second through fourth output test data Tout2-Tout4 from the second through fourth ports (port2-port4) of the semiconductor device 300 in response to second through fourth strobe signals str2-str4 applied from the second through fourth block test units 160, 170, 180, respectively, and output second through fourth test result data Trst2-Trst4 to the logic determiners 132 of the second through fourth block test units 160, 170, 180, respectively.

The semiconductor device 300 receives the first through fourth input data Tin1 to Tin4 and outputs the first through fourth output data Tout1 to Tout4 via the first through fourth ports port1 to port4. The function blocks 310 to 340 perform previously designed functions in response to the first through fourth input test data Tin1 to Tin4 and output the first through fourth output test data Tout1 to Tout4 as the result of the performed functions.

As a consequence, in order to test the semiconductor device 300 including a plurality of function blocks 310 to 340 operating at different speeds and a plurality of ports port1 to port4 corresponding respectively to the function blocks 310 to 340, the semiconductor device test system shown in FIG. 3 is constructed such that the test apparatus 100 generates not only the reference frequency signal Pfreq but also a plurality of selection frequency signals Mfreq1 to Mfreq3 and includes a plurality of block test units 150 to 180 corresponding respectively to the reference frequency signal Pfreq and the selection frequency signals Mfreq1 to Mfreq3. Thus, the function blocks 310 to 340 of the semiconductor device 300 can be tested in parallel at the same time. In other words, the semiconductor device test system shown in FIG. 3 allows the block test units 150, 160, 170, 180 to determine if the corresponding function blocks 310, 320, 330, 340 are normal, so that even if the function blocks 310-340 operate at different speeds, the semiconductor device test system can test all the function blocks 310-340 at the same time.

Therefore, the time taken to test the semiconductor device 300 can be shortened. Also, even if the function blocks 310 to 340 are interlocked, they can be tested under the same conditions as in actual service environment, thereby increasing test reliability.

It is described above with reference to FIG. 3 that each of the block test units 150 to 180 includes the test data generation unit 120 and the data determination unit 130. However, although the test apparatus 100 should include a plurality of test data generation units 120 in order to output the test data Tdata1 to Tdata4 corresponding to the plurality of function blocks 310 to 340 of the semiconductor device 300 at respectively different speeds corresponding to the function blocks 310 to 340, the test apparatus 100 may include only one data determination unit 130. When the test apparatus 100 includes only one data determination unit 130, the data determination unit 130 operates in response to the highest-frequency signal of the reference frequency signal Pfreq and the selection frequency signals Mfreq1 to Mfreq3. In this case, since the plurality of input drivers IDR1 to IDR4 operate in response to the corresponding ones of the reference frequency signal Pfreq and the selection frequency signals Mfreq1 to Mfreq3, the first through fourth test result data Trst1 to Trst4 are applied to the data determination unit 130 at different speeds from the operating speed of the data determination unit 130. Thus, errors may occur due to differences between the operating speed of the data determination unit 130 and the application speeds of the first through fourth test result data Trst1 to Trst4. In order to prevent the occurrence of the errors, the test apparatus 100 may further include a buffer memory between the data determination unit 130 and each of the input drivers IDR1 to IDR4. Furthermore, a flag for prioritizing the input drivers IDR1 to IDR4 may be set in order to prevent the input drivers IDR1 to IDR4 from transmitting the first through fourth test result data Trst1 to Trst4 to the data determination unit 130 at the same time.

In the semiconductor device test system shown in FIG. 3, the test apparatus 100 applies the input test data Tin1 to Tin4 to the function blocks 310 to 340 of the semiconductor device 300 at the same time and receives the output test data Tout1 to Tout4 from the function blocks 310 to 340 in order to test the semiconductor device 300. In other words, the semiconductor device test system tests the function blocks 310 to 340 of the semiconductor device 300 in parallel.

Figure 4:
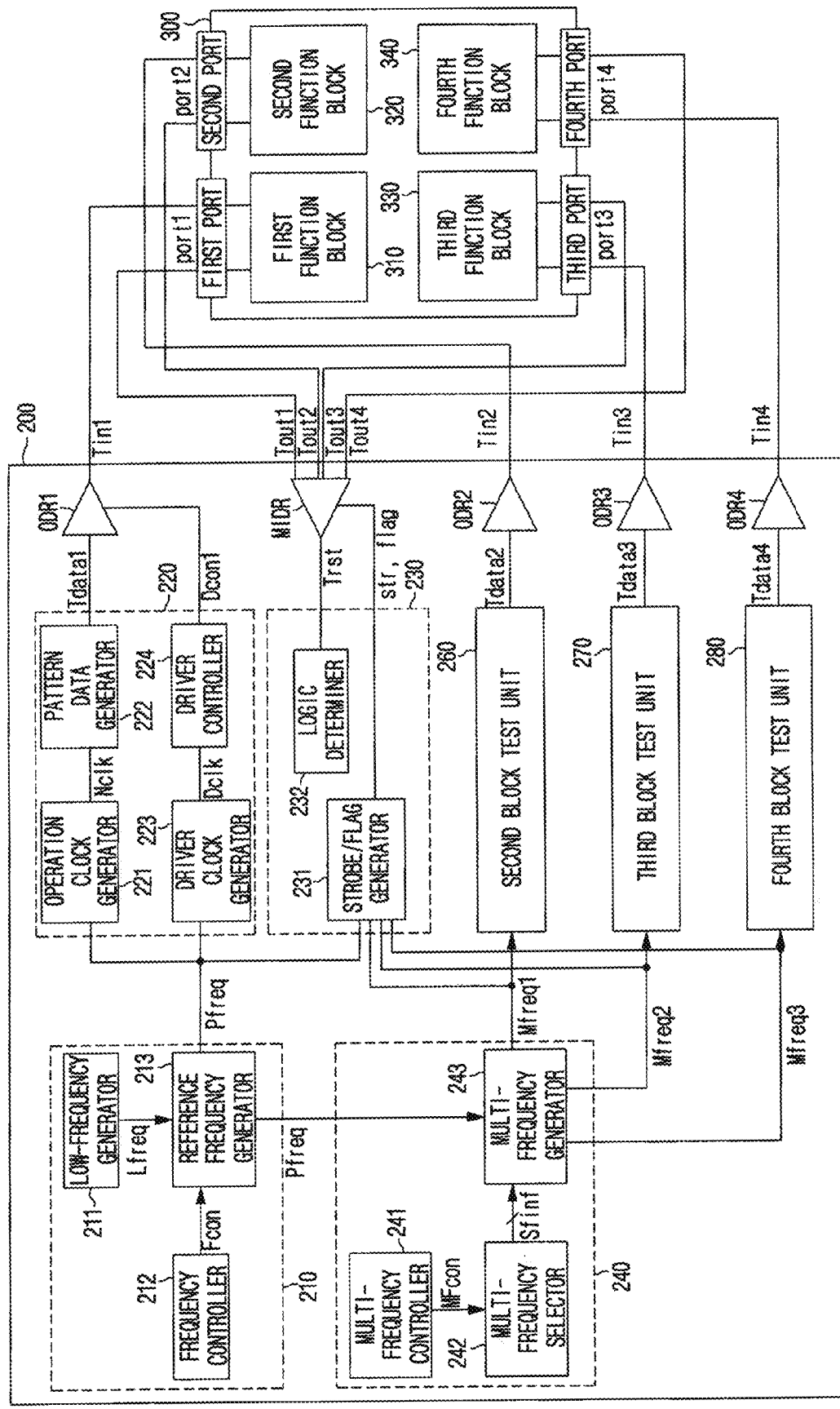
FIG. 4 is a diagram of a semiconductor device test system according to another example embodiment.

FIG. 4 is a diagram of a semiconductor device test system according to another example embodiment. Compared to the test system shown in FIG. 3, the test system shown in FIG. 4 is constructed such that a test apparatus 200 simultaneously applies a plurality of input test data Tin1 to Tin4 to a plurality of function blocks 310 to 340 of a semiconductor device 300 via a plurality of output drivers ODR1 to ODR4, while the test apparatus 200 serially receives a plurality of output test data Tout1 to Tout4 from the function blocks 310 to 340 via a single input driver MIDR.

Hereinafter, construction of the semiconductor device test system will be described with reference to FIG. 4. Referring to FIG. 4, the semiconductor device 300 includes a plurality of function blocks 310 to 340 and a plurality of ports (port1 to port4) like the semiconductor device 300 shown in FIG. 3. The function blocks 310 to 340 operate at different speeds, and receive and transmit data via the corresponding ports port1 to port4, respectively.

The test apparatus 200 includes a frequency generation unit 210, a multi-frequency generation unit 240, a plurality of test data generation units 220, 260, 270, 280, a plurality of output drivers ODR1, ODR2, ODR 3, ODR4 corresponding to the test data generation units 220, 260, 270, 280, respectively, and a single input driver MIDR.

Like the test system shown in FIG. 3, the frequency generation unit 210 includes a low-frequency generator 211, a frequency controller 212, and a reference frequency generator 213. The low-frequency generator 211 generates a stable low-frequency signal Lfreq, and the frequency controller 212 outputs a frequency control signal Fcon, which is set by a user, to the reference frequency generator 213. Also, the reference frequency generator 213 converts the low-frequency signal Lfreq into a high-frequency reference frequency signal Pfreq in response to the frequency control signal Fcon. The multi-frequency generation unit 240 includes a multi-frequency controller 241, a multi-frequency selector 242, and a multi-frequency generator 243. The multi-frequency controller 241 outputs a multi-frequency control signal MFcon in response to a user's command. The multi-frequency control signal indicates use or disuse of multiple frequencies. The multi-frequency selector 242 allows the user to select a frequency from a plurality of preset frequencies or directly designate a frequency in response to the multi-frequency control signal MFcon and outputs selection frequency information data Sfinf. The multi-frequency generator 243 converts the reference frequency signal Pfreq into a plurality of selection frequency signals Mfreq1 to Mfreq3 in response to the selection frequency information data Sfinf applied from the multi-frequency selector 242, and outputs the plurality of selection frequency signals Mfreq1 to Mfreq3.

Each of the test data generation units 220, 260, 270, 280 includes an operation clock generator 221, a pattern data generator 222, a driver clock generator 223, and a driver controller 224. The operation clock generator 221 of the first test data generation unit 220 generates an operation clock signal Nclk corresponding to the operating speed of the corresponding one of the function blocks 310 to 340 of the tested semiconductor device 300 in response to the reference frequency signal Pfreq. As in FIG. 3, FIG. 4 illustrates that the first test data generation unit 220 corresponds to the first function block 310 of the semiconductor device 300. Thus, assuming that the first function block 310 operates at a speed of 100 MHz, the operation clock generator 221 generates the operation clock signal Nclk at a speed corresponding to the frequency of 100 MHz. The pattern data generator 222 outputs first test data Tdata1 in response to the operation clock signal Nclk. The driver clock generator 223 generates a driver clock signal Dclk in response to the reference frequency signal Pfreq. The driver controller 224 outputs a driver control signal Dcon in response to the driver clock signal Dclk. The driver control signal Dcon is a signal for controlling the first output driver ODR1 that inputs and outputs data via the first port port1 of the semiconductor device 300.

The second through fourth test data generation units 260, 270, 280 receive selection frequency signals Mfreq1, Mfreq2, Mfreq3, respectively. The second through fourth test data generation units 260, 270, 280 generate an operation clock signal Nclk and a driver clock signal Dclk in response to the corresponding selection frequency signals Mfreq1 to Mfreq3, output test data Tdata2 to Tdata4 in response to the operation clock signal Nclk, and output a driver control signal (not shown) for controlling the corresponding output drivers ODR2 to ODR4 in response to the driver clock signal Dclk.

The first through fourth output drivers ODR1 to ODR4 receive the first through fourth test data Tdata1 to Tdata4 under the control of driver control signals Dcon applied from the first through fourth test data generators 260 to 280, and output first through fourth input test data Tin1 to Tin4 to the first through fourth ports port1 to port4 of the semiconductor device 300.

The input driver MIDR sequentially receives first through fourth output test data Tout1 to Tout4 from the first through fourth ports port1 to port4 of the semiconductor device 300 in response to a flag signal "flag." In this case, the input driver MIDR receives a strobe signal "str" corresponding to one of the first through fourth output test data Tout1 to Tout4, which is selected by the flag signal "flag," and determines if the first through fourth output test data Tout1 to Tout4 are precisely applied at specific points in time. Also, the input driver MIDR determines the strobe signal "str" of one of the output test data Tout1 to Tout4 selected by the flag signal "flag" and outputs test result data Trst to a logic determiner 232 based on the determination result.

The data determination unit 230 includes a strobe/flag generator 231 and the logic determiner 232. Unlike the test apparatus 100 of FIG. 3, the test apparatus 200 shown in FIG. 4 includes a single data determination unit 230. The strobe/flag generator 231 receives the reference frequency signal Pfreq and the selection frequency signals Mfreq1 to Mfreq3 and outputs the strobe signal "str" and the flag signal "flag." The flag signal "flag" is a signal for prioritizing the output test data Tout1 to Tout4 applied from the ports port1 to port4 of the semiconductor device 300, while the strobe signal "str" is a signal for determining if the output test data Tout1 to Tout4 are precisely applied at specific points in time. When the flag signal "flag" designates one of the output test data Tout1 to Tout4, the strobe/flag generator 231 outputs the strobe signal "str" in consideration of the operating speed of the corresponding one of the output test data Tout1 to Tout4. The logic determiner 232 compares the test result data Trst applied from the input driver MIDR with previously stored test expectation data, and determines if the semiconductor device 300 is normal.

As described above, the semiconductor device test system shown in FIG. 4 is constructed such that the test apparatus 200 sequentially receives the plurality of output test data Tout1 to Tout4 from the plurality of function blocks 310 to 340 of the semiconductor device 300 via the plurality of ports port1 to port4 in response to the flag signal "flag" and the strobe signal "str" output from the strobe/flag generator 231. Thus, the semiconductor device test system shown in FIG. 4 can test the semiconductor device 300 using the single data determination unit 230 and the single input driver MIDR.

Although it is described above that the semiconductor device 100 or 200 includes four function blocks and the test apparatus 300 outputs four input test data and receives four output test data, other embodiments are not so limited.

Also, although it is illustrated in FIGS. 3 and 4 that the reference frequency generation unit 110 or 210 is separated from the multi-frequency generation unit 140 or 240, when the first block test unit 150 and the first test data generation unit 220 are set to receive selection frequency signals from the multi-frequency generators 140 and 240, the frequency controller 112 or 212 and the reference frequency generator 113 or 213 of the reference frequency generation unit 110 or 210 may be omitted. In other words, it is also possible that the multi-frequency generator 140 or 240 may receive a low-frequency signal Lfreq from the low-frequency generator 111 or 211 and generate a plurality of selection frequency signals.

According to the example embodiments described above, in order to test a semiconductor device including a plurality of function blocks with different operating speeds and a plurality of ports corresponding respectively to the function blocks, a semiconductor device test system is constructed such that a test apparatus outputs a plurality of input test data via the corresponding ports to the function blocks and receives a plurality of output test data from the function blocks, thereby shortening the time taken to test the semiconductor device. Furthermore, even if the function blocks of the semiconductor device are interlocked, they can be tested under the same conditions as in actual service environment, thereby increasing test reliability.

Example embodiments have been disclosed herein and, although specific terms are employed, they are used and are to be interpreted in a generic and descriptive sense only and not for purposes of limitation. Accordingly, it will be understood by those of ordinary skill in the art that various changes in form and details may be made to the example embodiments without departing from the inventive principles as set forth in the following claims.

What is claimed is:

1. A semiconductor device test method using a test apparatus including a frequency generation unit and a plurality of block test units, each of the block test units including a test data generation unit and a data determination unit, said method comprising:

generating via the frequency generation unit a plurality of signals with different frequencies in response to a user's command;

generating via the test data generation unit a plurality of test data in response to the respective signals;

receiving the plurality of test data and outputting a plurality of input test data to a plurality of ports of a semiconductor device, respectively;

receiving a plurality of output test data from the plurality of ports of the semiconductor device and outputting test result data; and comparing via a data determination unit the test result data with previously stored test expectation data and determining if the semiconductor device is normal, wherein generating the signals comprises:

generating a stable low-frequency signal;

determining use or disuse of multiple frequencies in response to a user's command to output a multi-frequency control signal;

outputting a plurality of information data for designating frequencies of the signals in response to the multi-frequency control signal; and generating the plurality of signals in response to the plurality of information data, respectively.

2. The test method according to claim 1, wherein generating the plurality of test data comprises:

generating a plurality of operation clock signals in response to the signals, respectively;

generating the plurality of test data in response to the plurality of operation clock signals, respectively;

generating a plurality of driver clock signals in response to the signals, respectively; and generating a plurality of driver control signals in response to the driver clock signals, respectively.

3. The test method according to claim 1, wherein outputting the test data comprises receiving the plurality of test data in response to the plurality of driver control signals and outputting the plurality of input test data to the corresponding ports of the semiconductor device.

4. The test method according to claim 1, wherein receiving the test data comprises:

generating a plurality of strobe signals for designating points in time at which the plurality of output test data are respectively received in response to the signals; and receiving the plurality of output test data in response to the plurality of strobe signals and outputting the plurality of test result data.

5. The test method according to claim 4, wherein determining if the semiconductor device is normal comprises comparing the plurality of test result data with a plurality of previously stored test expectation data corresponding to the plurality of test data, respectively.

6. The test method according to claim 1, wherein receiving the test data comprises:

generating a flag signal for prioritizing the plurality of output test data in response to the plurality of signals and a strobe signal for designating points in time at which the plurality of output test data are received; and selecting one of the plurality of output test data in response to the flag signal and receiving the selected output test data in response to the strobe signal to output test result data.

7. The test method according to claim 6, wherein determining if the semiconductor device is normal comprises comparing the test result data with one selected from a plurality of previously stored test expectation data corresponding to the plurality of test data.

* * * * *